United States Patent
Kim et al.

(10) Patent No.: US 10,693,116 B2
(45) Date of Patent: Jun. 23, 2020

(54) POROUS SEPARATOR FOR SECONDARY BATTERY AND MANUFACTURING METHOD THEREOF

(71) Applicants: SK Innovation Co., Ltd., Seoul (KR); SK IE Technology Co., Ltd., Seoul (KR)

(72) Inventors: Hye Jin Kim, Daejeon (KR); Won Sub Kwack, Daejeon (KR); Min Sang Park, Daejeon (KR)

(73) Assignees: SK Innovation Co., Ltd., Seoul (KR); SK IE Technology Co., Ltd., Seoul (KR)

( * ) Notice: Subject to any disclaimer, the term of this patent is extended or adjusted under 35 U.S.C. 154(b) by 77 days.

(21) Appl. No.: 15/485,785

(22) Filed: Apr. 12, 2017

(65) Prior Publication Data
US 2017/0301902 A1    Oct. 19, 2017

(30) Foreign Application Priority Data

Apr. 15, 2016  (KR) ........................ 10-2016-0046321

(51) Int. Cl.
| | |
|---|---|
| *H01M 2/16* | (2006.01) |
| *C23C 16/455* | (2006.01) |
| *C23C 16/40* | (2006.01) |
| *H01M 2/14* | (2006.01) |
| *H01M 10/0525* | (2010.01) |

(52) U.S. Cl.
CPC .......... *H01M 2/1686* (2013.01); *C23C 16/40* (2013.01); *C23C 16/45527* (2013.01); *C23C 16/45553* (2013.01); *C23C 16/45555* (2013.01); *H01M 2/145* (2013.01); *H01M 2/1646* (2013.01); *H01M 2/1653* (2013.01); *H01M 10/0525* (2013.01)

(58) Field of Classification Search
None
See application file for complete search history.

(56) References Cited

U.S. PATENT DOCUMENTS

| | | | | |
|---|---|---|---|---|
| 2011/0200863 A1* | 8/2011 | Xiao | ...................... | H01M 2/16 429/144 |
| 2012/0202103 A1* | 8/2012 | Yu | ..................... | H01M 10/4257 429/144 |
| 2013/0037312 A1 | 2/2013 | Masuda et al. | | |

* cited by examiner

*Primary Examiner* — Alix E Eggerding
(74) *Attorney, Agent, or Firm* — The Webb Law Firm (57) ABSTRACT

Provided is a porous separator for a secondary battery including an inorganic oxide layer formed on a porous substrate by an atomic layer deposition process, such that a thin separator having excellent heat stability, permeability and electrolyte impregnability may be provided by controlling specific conditions in the process and thicknesses of the inorganic oxide layers on a surface and inside of the porous separator.

7 Claims, 2 Drawing Sheets

POROUS SEPARATOR FOR SECONDARY BATTERY AND MANUFACTURING METHOD THEREOF

CROSS-REFERENCE TO RELATED APPLICATION

This application claims priority to Korean Patent Application No. 10-2016-0046321 filed Apr. 15, 2016, the disclosure of which is hereby incorporated in its entirety by reference.

TECHNICAL FIELD

The following disclosure relates to a porous separator for an electrochemical device, particularly, for a secondary battery, and a manufacturing method thereof. In addition, the following disclosure relates to a novel separator for a lithium secondary battery capable of remarkably increasing high heat resistance and simultaneously providing a high capacity battery.

BACKGROUND

A separator of a battery in an electrochemical device is significantly important for improving stability, life and performance of the battery. Main functions of the separator are to provide a moving path of ions in the battery and to prevent physical contact between an anode and a cathode. Properties of the separator may be improved to manufacture a battery having excellent performance.

In order to improve the properties of the separator used in the battery, a multilayer separator formed by stacking a porous polymer such as a polyolefin-based polymer or a polypropylene-based polymer, or a separator including a coating layer formed by mixing a binder and inorganic particles, etc., while using the porous polymer as a substrate has been developed. The multilayer separator or the coating layer mixed with the binder, etc., may improve various properties of the separator as compared to a single layer separator. However, a thickness of the separator may be increased, and the performance of the battery may be rather reduced due to low permeability, reduction in wettability, and deterioration of impregnability.

As described above, it is difficult to manufacture a separator capable of having various properties that are sufficiently suitable for the separator of the battery, having a thin thickness, and satisfying mechanical and chemical stability to improve the performance of the battery. U.S. Patent Application Publication No. 2013-0037312 discloses a separator having excellent heat shrinkage by depositing alumina on a monolayer porous polymer substrate through a gaseous metal precursor. However, in this patent document, improvement in battery performance according to improvement in the heat shrinkage was not significantly increased.

RELATED ART DOCUMENT (Patent Document 1) U.S. Patent Application Publication No. 2013-0037312

SUMMARY

An embodiment of the present disclosure is directed to providing a porous separator including an inorganic oxide layer formed on a porous substrate to have excellent properties, particularly, performance of a secondary battery, by controlling a deposition amount of a precursor, a thickness of an inorganic oxide, and process conditions, etc., and a manufacturing method thereof.

In one general aspect, a porous separator includes an inorganic oxide layer formed on a porous substrate by an atomic layer deposition process, wherein a thickness of the inorganic oxide layer is decreased in a direction from a surface of the porous substrate to a center thereof, and the following Relational Equations I and II are defined:

$$8 \leq \{(10t_s + t_r) \times C\}/100 \quad \text{[Relational Equation I]}$$

($t_s$ is time (sec) for injecting a metal precursor, $t_r$ is time (sec) for injecting an oxidant, and C is the number of repetitions of the atomic layer deposition process.)

$$T_h/T_s \leq 0.80 \quad \text{[Relational Equation II]}$$

($T_s$ is a thickness of the inorganic oxide layer on a surface of the porous separator, $T_h$ is a thickness of the inorganic oxide layer formed in internal pores at a position corresponding to ½ of a total thickness of the porous separator in a direction from the surface of the porous separator to the center of the porous separator.)

DETAILED DESCRIPTION OF EMBODIMENTS

The present disclosure will be described in detail. Unless indicated otherwise in the specification, it is to be understood that all of the technical terms used in the specification are construed as meaning as those that are generally understood by those skilled in the art.

The present disclosure relates to a porous separator capable of being used in an electrochemical device.

The present disclosure is directed to providing the porous separator in which an inorganic oxide layer is formed on a porous substrate by an atomic layer deposition process, which is characterized by controlling a thickness of the inorganic oxide layer to improve physical properties of the separator. In addition, it is characterized by controlling time for injecting a metal precursor, time for injecting an oxidant, and the number of repetitions of the atomic layer deposition process in forming the inorganic oxide layer, thereby improving the physical properties of the separator.

The present disclosure provides a porous separator including an inorganic oxide layer formed on a porous substrate by an atomic layer deposition process, wherein a thickness of the inorganic oxide layer is decreased in a direction from a surface of the porous substrate to a center thereof, and the following Relational Equations I and II are defined:

$$8.0 \leq \{(10t_s+t_r) \times C\}/100 \quad \text{[Relational Equation I]}$$

($t_s$ is time (sec) for injecting a metal precursor, $t_r$ is time (sec) for injecting an oxidant, and C is the number of repetitions of the atomic layer deposition process.)

$$T_h/T_s \leq 0.80 \quad \text{[Relational Equation II]}$$

($T_s$ is a thickness of the inorganic oxide layer on a surface of the porous separator, $T_h$ is a thickness of the inorganic oxide layer formed in internal pores at a position corresponding to ½ of a total thickness of the porous separator in a direction from the surface of the porous separator to the center of the porous separator.)

In present disclosure, the inorganic oxide layer may be formed by the atomic layer deposition process. Specifically, the atomic layer deposition process is performed by including (a) injecting a metal precursor into a vacuum chamber after mounting a porous substrate in the vacuum chamber, (b) purging the metal precursor, (c) injecting an oxidant, and (d) purging the oxidant. More specifically, the metal precursor may be injected to have a contact in step (a), the metal precursor may be purged with an inert gas in step (b), the oxidant may be injected to have a content in step (c), and the oxidant may be purged with the inert gas in step (d), thereby forming the inorganic oxide layer. In addition, it is considered that the above-described steps (a) to (d) may correspond to performing the atomic layer deposition process once. A thickness and gas permeability of a metal oxide layer of the porous separator may be controlled by repeating the atomic layer deposition process two or more times.

In the atomic layer deposition process, the relationship among the injection time ($t_s$) in the step of injecting the metal precursor, the injection time ($t_r$) in the step of injecting the oxidant, and the number of repetitions (C) in the atomic layer deposition process is related to heat stability and gas permeability of the porous separator, and is particularly important for significantly increasing heat shrinkage of the separator. In addition, together with the above-described relationship, a thickness ratio of the metal oxide layers formed on a surface and inside of the separator by the atomic layer deposition process is related to the gas permeability and the heat stability of the separator, and is particularly important in controlling a sharp rise in the gas permeability of the porous separator.

According to the present disclosure, although the exact reason is not known, a porous separator having excellent heat stability and gas permeability may be manufactured when the relationship values among the time ($t_s$) for injecting a metal precursor, the time ($t_r$) for injecting an oxidant, and the number of repetitions (C) in the atomic layer deposition process satisfies a specific range, and simultaneously, the ratio ($T_h/T_s$) of the surface and the inside of the porous separator satisfies a specific range, in the atomic layer deposition process.

According to an exemplary embodiment of the present disclosure, the porous separator having a gas permeability suitable for a lithium secondary battery while having excellent heat shrinkage may be manufactured by satisfying the specific conditions according to the time for injecting a metal precursor, the time for injecting an oxidant, and the number of repetitions in the process of forming the inorganic oxide layer on the porous separator through the atomic layer deposition process, and simultaneously by controlling the thickness ratio between the thickness of the inorganic oxide layer formed on the surface of the porous separator and the thickness of the inorganic oxide layer formed inside the porous separator to satisfy the specific thickness ratio.

In the present disclosure, the relationship among the time ($t_s$) for injecting a metal precursor, the time ($t_r$) for injecting an oxidant, and the number of repetitions (C) as described above is shown as $G_f$ as follows:

$$G_f = \{(10t_s+t_r) \times C\}/100$$

According to the present disclosure, when the range of $G_f$ corresponds to the same range as the [Relational Equation I], and at the same time, the specific thickness ratio of the inorganic oxide layers formed on the surface and the inside of the porous separator satisfies the [Relational Equation II], a thin film separator having excellent permeability, electrolyte impregnability, and stability may be manufactured:

$$8.0 \leq \{(10t_s+t_r) \times C\}/100 \quad \text{[Relational Equation I]}$$

$$T_h/T_s \leq 0.80 \quad \text{[Relational Equation II]}$$

Here, the metal precursor may be injected to contact the porous substrate at the time ($t_s$) for injecting a metal precursor of 0.1 to 30 seconds, 0.2 to 30 seconds, 0.3 to 30 seconds, 0.4 to 30 seconds, 0.5 to 30 seconds, 0.1 to 20 seconds, 0.2 to 20 seconds, 0.3 to 20 seconds, 0.4 to 20 seconds, 0.5 to 20 seconds. However, the time for injecting a metal precursor is not limited thereto, and may be appropriately controlled according to the time ($t_r$) for injecting an oxidant and the number of repetitions (C) of the atomic layer deposition process.

The time ($t_r$) for injecting an oxidant may be 0.1 to 40 seconds, 0.2 to 40 seconds, 0.3 to 40 seconds, 0.4 to 40 seconds, 0.5 to 40 seconds, 0.1 to 30 seconds, 0.2 to 30 seconds, 0.3 to seconds, 0.4 to 30 seconds, 0.5 to 30 seconds, 0.1 to 20 seconds, 0.2 to 20 seconds, 0.3 to 20 seconds, 0.4 to 20 seconds, 0.5 to 20 seconds, but is not limited thereto, and may be appropriately controlled according to the time ($t_s$) for injecting a metal precursor and the number of repetitions (C).

The number of repetitions (C) is preferably 20 to 200, but is not limited thereto, and may be appropriately controlled to 25 to 190 times, 30 to 180 times, 35 to 160 times, etc., according to the time ($t_s$) for injecting a metal precursor and the time ($t_r$) for injecting an oxidant. However, when the number of repetitions of the process is 20 or less times, the inorganic oxide layer may not be properly formed to an inner center of the porous separator, and when the number of repetitions of the process is 200 or more times, the time for injecting a metal precursor and the time for injecting an oxidant may be increased, and thus, the inorganic oxide layer of the porous separator may be excessively thick, which may decrease a pore diameter and deteriorate physical properties of the separator.

When $G_f$ is 8.0 or more according to the [Relational Equation I] of the present disclosure, the separator having excellent heat shrinkage while simultaneously having good gas permeability may be manufactured. When $G_f$ is increased in the range of the thickness ratio of the inorganic oxide layer of the [Relational Equation II], the heat shrinkage may be further reduced.

According to an exemplary embodiment of the present disclosure, when $G_f$ is 8.0 or more, the heat stability may be rapidly increased. Particularly, a longitudinal heat shrinkage of the porous separator is 3% or less, and a transverse heat shrinkage of the porous separator is 10% or less, and thus, the porous separator having significantly excellent heat stability may be manufactured. According to another exemplary embodiment of the present disclosure, when the $G_f$ is less than 8.0, the heat shrinkage in the longitudinal direction and/or the transverse direction may be rapidly increased, and thus, the heat shrinkage of the separator may be significantly changed with the relationship value $G_f$ of about 8.0.

In the porous separator of the present disclosure, the inorganic oxide layer is formed by the atomic layer deposition process, and the thickness of the inorganic oxide layer is the thickest on the surface, and the thickness thereof is decreased from the surface of the porous separator toward the inside. Although the thickness of the inorganic oxide layer is decreased toward the inside, the rate of decrease in thickness may not follow a certain trend such as a linear decrease, etc., and the thickness ratio between the surface and the inside of the inorganic oxide layer may be varied depending on conditions in the atomic layer deposition process. Therefore, the physical properties of the porous separator may be significantly changed depending on the conditions and the thickness ratio between the surface and the inside of the inorganic oxide layer in the process of forming the inorganic oxide layer according to the atomic layer deposition method.

In the present disclosure, the inorganic oxide layer of the porous separator is formed all from the surface to the inner center of the porous separator, and the heat stability may be maximized by the specific ratio of the inorganic oxide layer on the surface of the porous separator and the inorganic oxide layer inside the porous separator.

According to the present disclosure, the physical properties of the separator may be significantly changed depending on the specific ratio between the thickness of the inorganic oxide layer formed at a position corresponding to ½ of a total thickness of the porous separator and the thickness of the inorganic oxide layer formed on the surface of the porous separator in a direction from the surface of the porous separator to the center of the porous separator.

According to an exemplary embodiment of the present disclosure, the ratio $(T_h/T_s)$ between the thickness $(T_s)$ of the inorganic oxide layer formed on the surface of the porous separator and the thickness $(T_h)$ of the inorganic oxide layer formed in internal pores at a position corresponding to ½ of the total thickness of the porous separator in a direction from the surface of the porous separator to the center of the porous separator is 0.8 or less, 0.2 to 0.8, preferably 0.25 to 0.80, and most preferably 0.3 to 0.8.

According to a measurement method of the present disclosure, the thickness $(T_t)$ of the inorganic oxide layer on the surface of the porous separator indicates a thickness of the inorganic oxide layer formed in pores of an externally exposed portion, which is determined by measuring the thicknesses (nm) at corresponding five points and calculating an average value thereof. The thickness $(T_h)$ of the inorganic oxide layer formed in the internal pores at the position corresponding to ½ of the total thickness of the porous separator in a direction from the surface of the porous separator to the center of the porous separator is also determined by measuring the thicknesses (nm) at corresponding five points and calculating an average value thereof.

According to the present disclosure, as the ratio $(T_h/T_s)$ between the surface and the inside of the porous separator is increased, the heat stability of the porous separator may be improved. However, when the $T_h/T_s$ value of the porous separator is more than 0.8, the gas permeability (gas permeation time) is rapidly increased. Specifically, as the thickness of the inorganic oxide layer formed on the porous separator is increased, the heat stability is increased, which is suitable for improving the stability of the battery. However, if gas permeability is extremely high, ion mobility rapidly drops at the time of being actually applied as a separator for a lithium ion battery, resulting in deterioration in an output characteristic of the battery. Accordingly, since a porous separator having an excessively high gas permeation time is not suitable for the battery, it is required to control the gas permeability.

According to an exemplary embodiment of the present disclosure, the gas permeability does not exceed 500 (sec/100 cc) when the ratio $(T_h/T_s)$ between the surface and the inside of the porous separator is 0.8 or less while satisfying the [Relational Equation I] of the present disclosure. However, when the ratio $(T_h/T_s)$ between the surface and the inside of the porous separator is more than 0.8, the gas permeability is rapidly increased to exceed 700 (sec/100 cc) in most cases, and the ion mobility is rapidly decreased to form a separator which is not usable for a lithium secondary battery. The gas permeability of the separator may be controlled according to the specific condition and the ratio between the surface and the inside of the separator at the time of forming the inorganic oxide layer by the atomic layer deposition process, and at the same time, the separator may have excellent heat stability.

According to an exemplary embodiment of the present disclosure, when the $G_f$ is 8 or more to 100 or less, and the ratio $(T_h/T_s)$ of the surface and inside of the porous separator is 0.2 or more to 8.0 or less, it is possible to manufacture the most excellent separator for a lithium secondary battery. However, the present disclosure is not limited thereto. As the $G_f$ of the porous separator is increased, the heat stability of the separator may be increased. When the ratio $(T_h/T_s)$ between the surface and the inside of the inorganic oxide layer satisfies 8.0 or less, a separator desired in the present disclosure may be obtained.

According to an exemplary embodiment of the present disclosure, a material of the porous substrate of the present disclosure is the most preferably polyethylene, but is not limited as long as it is a general material used as the separator of the electrochemical device. For example, the material of the porous substrate may be a copolymer of one or more selected from the group consisting of high density polyethylene, low density polyethylene, polypropylene, polyimide, polycarbonate, polyamide, polyacetal, polyethersulfone, polyester, polyphenylene oxide, polyethylene naphthalene, or monomers of these polymers.

The thickness of the porous substrate in the present disclosure is 5 to 40 µm, 10 to 40 µm, 15 to 40 µm, 20 to 40 µm, 25 to 40 µm, 30 to 40 µm, 5 to 35 µm, 10 to 35 µm, 15 to 35 µm, 20 to 35 µm, 25 to 35 µm, 5 to 30 µm, 10 to 30 µm, 15 to 30 µm, and preferably, 20 to 30 µm, but is not limited thereto, and the separator of the present disclosure may be made thinner than conventional separators, by using a thin substrate.

An average pore diameter of the porous substrate in the present disclosure is 1 to 5000 nm, 1 to 4000 nm, 1 to 3000 nm, 1 to 2000 nm, 1 to 1000 nm, 1 to 500 nm, 1 to 400 nm, 1 to 300 nm, 1 to 200 nm, 1 to 100 nm, 5 to 90 nm, 5 to 80 nm, 5 to 70 nm, 5 to 60 nm, 5 to 50 nm, 10 to 50 nm, 15 to 50 nm, 20 to 50 nm, 25 to 50 nm, 30 to 50 nm, 35 to 50 nm, 40 to 50 nm, 5 to 45 nm, 10 to 45 nm, 15 to 45 nm, 20 to 45 nm, 25 to 45 nm, 30 to 45 nm, and preferably, 35 to 45 nm, but is not limited thereto. The average pore diameter may be appropriately controlled in consideration of porosity and the thickness of the inorganic oxide layer formed by the atomic layer deposition process.

The porosity of the porous substrate in the present disclosure is 20% to 80%, 20% to 70%, 20% to 60%, 20% to 50%, 20% to 40%, 30% to 80%, 30% to 70%, 30% to 60%, 30% to 50%, 40% to 80%, 40% to 70%, 40% to 60%, 50% to 80%, 50% to 70%, and preferably, 55 to 65%, but is not limited thereto. The porosity may be appropriately controlled in consideration of the average pore diameter of the porous substrate and the thickness of the inorganic oxide layer formed by the atomic layer deposition process.

In the present disclosure, a substrate surface energy is preferably 30 to 50 dyne/cm, but is not limited thereto.

In the present disclosure, the inorganic oxide layer is formed by treating the precursor with an oxidant through the atomic layer deposition process. The inorganic oxide layer may include at least one inorganic oxide selected from $SrTiO_3$, $SnO_2$, $CeO_2$, $MgO$, $NiO$, $CaO$, $ZnS$, $ZnOS$, $ZrO_2$, $Y_2O_3$, $SiC$, $CeO_2$, $MgO$, $WO_3$, $Ta_2O_5$, $RuO_2$, $NiO$, $BaTiO_3$, $Pb(Zr, Ti)O_3(PZT)$, $HfO_2$, $SrTiO_3$, $NiO$, $ZrO_2$, $Al_2O_3$, $SiO_2$, $TiO_2$, and $ZnO$, and the inorganic oxide layer is not limited as long as it is the inorganic oxide layer that may be formed at the time of manufacturing the separator using the atomic layer deposition process.

The precursor used in the atomic layer deposition process in the present disclosure may preferably include one or more selected from trimethylaluminum (TMA), $AlCl_3$, diethylzinc (DEZ), $TiCl_4$, $Ti[(OCH)(CH_3)_2]_4$, $SiCl_4$, and tetrakis-ethyl-methyl-amino-Silicon (TEMASi) as the metal precursor, but is not limited thereto. Any metal precursor for forming an inorganic oxide layer using the atomic layer deposition process may be freely used.

The thickness of the inorganic oxide layer in the present disclosure is 0.5 to 40 nm, 1 to 40 nm, 2 to 40 nm, 3 to 40 nm, 4 to 40 nm, 5 to 40 nm, 6 to 40 nm, 7 to 40 nm, 8 to 40 nm, 9 to 40 nm, 10 to 40 nm, 0.5 to 35 nm, 1 to 35 nm, 2 to 35 nm, 3 to 35 nm, 4 to 35 nm, 5 to 35 nm, 6 to 35 nm, 7 to 35 nm, 8 to 35 nm, 9 to 35 nm, 10 to 35 nm, 0.5 to 30 nm, 1 to 30 nm, 2 to 30 nm, 3 to 30 nm, 4 to 30 nm, 5 to 30 nm, 6 to 30 nm, 7 to 30 nm, 8 to 30 nm, 9 to 30 nm, 10 to 30 nm, but is not limited thereto. More specifically, the thickness of the inorganic oxide layer on the surface of the separator is 0.5 to 20 nm, 1 to 20 nm, 2 to 20 nm, 3 to 20 nm, 4 to 20 nm, 5 to 20 nm, 6 to 20 nm, 7 to 20 nm, 8 to 20 nm, 9 to 20 nm, 10 to 20 nm, 0.5 to 15 nm, 1 to 15 nm, 2 to 15 nm, 3 to 15 nm, 4 to 15 nm, 5 to 15 nm, 6 to 15 nm, 7 to 15 nm, 8 to 15 nm, 9 to 15 nm, 10 to 15 nm, but is not limited thereto. In addition, the thickness of the inorganic oxide layer formed in the internal pores at the position corresponding to ½ of the total thickness of the porous separator in a direction from the surface of the porous separator to the center of the porous separator is 0.5 to 35 nm, 1 to 35 nm, 2 to 35 nm, 3 to 35 nm, 4 to 35 nm, 5 to 35 nm, 6 to 35 nm, 7 to 35 nm, 8 to 35 nm, 9 to 35 nm, 10 to 35 nm, 0.5 to 30 nm, 1 to 30 nm, 2 to 30 nm, 3 to 30 nm, 4 to 30 nm, 5 to 30 nm, 6 to 30 nm, 7 to 30 nm, 8 to 30 nm, 9 to 30 nm, 10 to 30 nm, but is not limited thereto. Further, the thickness of the inorganic oxide layer formed on the center of the separator is 0.5 to 40 nm, 1 to 40 nm, 2 to 40 nm, 3 to 40 nm, 4 to 40 nm, 5 to 40 nm, 6 to 40 nm, 7 to 40 nm, 8 to 40 nm, 9 to 40 nm, 10 to 40 nm, 0.5 to 35 nm, 1 to 35 nm, 2 to 35 nm, 3 to 35 nm, 4 to 35 nm, 5 to 35 nm, 6 to 35 nm, 7 to 35 nm, 8 to 35 nm, 9 to 35 nm, 10 to 35 nm, but is not limited thereto. In the present disclosure, the thickness of the inorganic oxide layer may vary depending on the number of atomic layer deposition processes, the time for injecting a metal precursor, and the time for injecting an oxidant.

Hereinafter, a manufacturing method of a porous separator according to the present disclosure is described.

The manufacturing method of a porous separator according to the present disclosure is to form the inorganic oxide layer on the porous substrate by the atomic layer deposition process, and includes (a) injecting a metal precursor after mounting a porous separator in the chamber, (b) purging the metal precursor, (c) injecting an oxidant, and (d) purging the oxidant.

The atomic layer deposition process is preferably performed under vacuum condition, but is not limited thereto. Specifically, the porous substrate is introduced into the chamber for performing the atomic layer deposition process, and a gaseous precursor is introduced into the chamber. After the precursor is introduced, the chamber is purged with an inert gas such as nitrogen, hydrogen, argon, krypton, or the like. After the purging, gas including the oxidant which includes water, oxygen, water vapor, or the like, is introduced to form the inorganic oxide layer.

In the present disclosure, the atomic layer deposition process may be performed at a temperature at which deformation, reduction in pore size or pore closure of the porous substrate does not occur. The temperature may be performed at 40 to 130° C., 50 to 120° C., 60 to 120° C., 60 to 110° C., 70 to 110° C., 80 to 110° C., and preferably, 90 to 110° C., but is not limited thereto.

The manufacturing method of the porous separator of the present disclosure may further include surface modification after fixing the porous substrate. The surface modification method may include plasma, corona discharge, acrylic acid or urea-impregnated surface modification.

The porous separator desired in the present disclosure may be manufactured by controlling time for performing each step in the manufacturing method of the present disclosure.

According to an exemplary embodiment of the present disclosure, the step of injecting the metal precursor (a) is preferably performed by injecting the metal precursor for 0.1 to 30 seconds, 0.2 to 30 seconds, 0.3 to 30 seconds, 0.4 to 30 seconds, 0.5 to 30 seconds, 0.1 to 20 seconds, 0.2 to 20 seconds, 0.3 to 20 seconds, 0.4 to 20 seconds, 0.5 to 20 seconds to contact the metal precursor to the porous substrate, but the injection time is not limited thereto. The step of purging the metal precursor (b) is preferably performed for 1.0 to 40 seconds, 2.0 to 40 seconds, 3.0 to 40 seconds, 4.0 to 40 seconds, 5.0 to 40 seconds, 1.0 to 30 seconds, 2.0 to 30 seconds, 3.0 to 30 seconds, 4.0 to 30 seconds, 5.0 to 30 seconds, but the purging time is not limited thereto. The step of injecting the oxidant (c) is preferably performed for 0.1 to 40 seconds, 0.2 to 40 seconds, 0.3 to 40 seconds, 0.4 to 40 seconds, 0.5 to 40 seconds, 0.1 to 30 seconds, 0.2 to 30 seconds, 0.3 to 30 seconds, 0.4 to 30 seconds, 0.5 to 30 seconds, 0.1 to 20 seconds, 0.2 to 20 seconds, 0.3 to 20 seconds, 0.4 to 20 seconds, 0.5 to 20 seconds, but the injection time is not limited thereto. The step of purging the oxidant (d) is preferably performed for 1.0 to 40 seconds, 2.0 to 40 seconds, 3.0 to 40 seconds, 4.0 to 40 seconds, 5.0 to 40 seconds, 1.0 to 30 seconds, 2.0 to 30 seconds, 3.0 to 30 seconds, 4.0 to 30 seconds, 5.0 to 30 seconds, but the purging time is not limited thereto.

A rate at which the metal precursor is injected in the atomic layer deposition process according to the present disclosure is 50 to 700 sccm, 100 to 700 sccm, 200 to 600 sccm, 200 to 600 sccm, 300 to 500 sccm, 400 to 600 sccm, and preferably, 450 to 550 sccm, but is not limited thereto, and a rate at which the oxidant is injected is 50 to 700 sccm, 100 to 700 sccm, 200 to 600 sccm, 200 to 600 sccm, 300 to 500 sccm, 400 to 600 sccm, and preferably, 450 to 550 sccm, but is not limited thereto.

In the present disclosure, the above-described steps (a) to (d) correspond to performing the atomic layer deposition process once, and the number of repetitions may be controlled to 20 to 200 times, 25 to 190 times, 30 to 180 times, 35 to 160 times, etc., according to the time ($t_s$) for injecting a metal precursor and the time ($t_r$) for injecting an oxidant. However, when the process is performed 20 or less times, it may be difficult for all of the inorganic oxide layers of the separator desired in the present disclosure to be formed up to the inside, and when the process is performed 200 or more times, the inorganic oxide layer formed on the porous substrate may be excessively thick depending on the time for injecting a metal precursor, the time for injecting an oxidant, and the average pore size of the substrate, etc., which may deteriorate physical properties of the porous separator.

The porous separator according to the present disclosure has excellent permeability, electrolyte impregnability, and low heat shrinkage, and also has high melt fracture temperature.

The porous separator of the present disclosure is usable for the electrochemical device, and is particularly suitable for the separator for a lithium secondary battery.

Hereinafter, specific exemplary embodiments for practicing the present disclosure are described. The following Examples are provided as an example for practicing the present disclosure, and therefore, the disclosure of the present disclosure is not limited to the following Examples, or is not construed to be limited thereto.

Measuring Method of Physical Properties (1) Gas Permeability (Gurley Densometer)

The gas permeability was measured using a Gurley densometer (Toyoseiki). The gas permeability is determined by time required for a predetermined volume (100 mL or 100 cc) of gas to pass through a predetermined area (1 in$^2$) at a constant pressure (about 1-2 psig) with the unit of seconds.

(2) Thickness of Film (μm)

The thickness was measured using a contact type thickness measurement device where accuracy for the thickness is 0.1 μm.

(3) Average Pore Diameter (nm)

The pore diameter was measured by a half-dry method according to ASTM F316-03 using a porometer (PMI).

(4) Porosity

The porosity was calculated from Equation 1 below using a cut rectangular specimen having a size of A cm×B cm. Both of A and B had a range of 5 to 20 cm, respectively.

$$\text{Porosity}=(A\times B\times T)-(M\div\rho)\div(A\times B\times T)\times 100 \quad \text{[Equation 1]}$$

wherein T=Thickness of separator (cm)
M=Specimen mass (g)
ρ=Resin density (g/cm$^3$)

(5) Gas Permeability (Gurley Densometer)

The gas permeability was measured using a Gurley densometer (Toyoseiki). The gas permeability is determined by time required for a predetermined volume (100 mL or 100 cc) of gas to pass through a predetermined area (1 inch$^2$) at a constant pressure (about 1-2 psig) with the unit of seconds.

(6) Deposition Thickness (nm)

A deposition thickness of the inorganic metal compound on a composite microporous membrane by the ALD film-formation method was measured by sectional pre-processing using an ion miller. The deposition thickness of the inorganic metal compound by depth was measured by FE-SEM and DB-FIB.

The thickness ($T_s$) of the inorganic oxide layer on the surface was determined by measuring the thicknesses at five points of the uppermost layer of the sectioned specimen and calculating an average value thereof, and the thickness ($T_h$) of the inorganic oxide layer formed on the inside was determined by measuring the thicknesses at five points at a position corresponding to ½ of a total thickness of the porous separator and calculating an average value thereof.

(7) Shrinkage (%)

A Teflon sheet was put between glass plates, and force of 7.5 mg/mm$^2$ was applied to a composite microporous membrane to be measured. Then, the specimen was left in an oven at 150° C. for 1 hour. Next, shrinkage in a longitudinal direction (MD) and in a transverse direction (TD) was measured, and the final area shrinkage was calculated in %.

(8) TMA Maximum Shrinkage and Melt Fracture Temperature

A temperature of a specimen having a size of 6 mm×10 mm with a weight of 0.015 N was raised at a rate of 5° C./min using thermo-mechanical analysis (TMA) equipment manufactured by Meller Toledo. The specimen manufactured by stretching shrank at a predetermined temperature, and when the temperature was more than Tg and Tm, the specimen was stretched due to the mass of the weight. The TMA maximum shrinkage is defined as a value (represented by %) of a shrinkage deformation length relative to an initial measurement length at the maximum shrinkage point occurring at a predetermined temperature, and starts to increase by the mass of the weight, wherein a temperature at which the specimen starts to have a length exceeding an initial length (zero point) is defined as the melt fracture temperature. Further, in a specimen without shrinkage, the melt fracture temperature was defined as the temperature that meets with an x-axis based on the maximum slope.

Example 1

A polyethylene substrate having an average pore size of 40 nm, a porosity of 60% and a thickness of 25 μm was fixed in a 100° C. chamber, and then, treated with 14 kV plasma at a rate of 3 m/min. A process of injecting trimethylaluminum (Al(CH$_3$)$_3$) at 500 sccm for 1 second for contact, purging with argon (Ar) for 5 seconds, injecting hydrogen peroxide (H$_2$O$_2$) at 500 sccm for 5 seconds as the oxidant, and purging again with argon (Ar) for 15 seconds was repeated 80 times. The thickness of the inorganic oxide layer of the porous separator manufactured as above was measured to be about 18 nm, and the Gurley value was measured to be 191 sec/100 cc.

Examples 2 to 43 and Comparative Examples 1 to 17

The porous separators of Examples 2 to 43 and Comparative Examples 1 to 17 were manufactured by performing the same method as Example 1 except for only changing the time for injecting trimethylaluminum (Al(CH$_3$)$_3$) for contact, and the time for injecting hydrogen peroxide as the oxidant as shown in [Table 1] below.

[Table 1] below shows process conditions, thicknesses between the inside and outside of the porous separators, and ratios thereof, and gas permeability and heat shrinkage of the porous separators manufactured according to Examples 2 to 43 and Comparative Examples 1 to 17.

TABLE 1

| | $t_s$ (sec) | $t_r$ (sec) | C (the number of times) | $G_f$ | $T_s$ (nm) | $T_h$ (nm) | $T_h/T_s$ | Gas permeability (sec/100 cc) | Heat shrinkage (MD/TD, %) |
|---|---|---|---|---|---|---|---|---|---|
| Comparative Example 1 | 0.2 | 1.0 | 80 | 2.40 | 12.32 | 2.31 | 0.19 | 160 | 27.7/33.3 |
| Comparative Example 2 | 0.1 | 1.0 | 159 | 3.18 | 20.94 | 3.69 | 0.18 | 231 | 35.3/38.5 |
| Comparative Example 3 | 0.5 | 1.0 | 80 | 4.80 | 16.02 | 3.80 | 0.24 | 207 | 20.1/30.5 |
| Comparative Example 4 | 0.2 | 3.0 | 125 | 6.25 | 18.82 | 3.60 | 0.19 | 228 | 2.3/13.8 |
| Comparative Example 5 | 0.5 | 3.0 | 80 | 6.40 | 16.55 | 4.54 | 0.27 | 221 | 12.0/11.5 |
| Comparative Example 6 | 0.5 | 1.0 | 125 | 7.50 | 17.75 | 5.01 | 0.28 | 245 | 18.8/25.6 |
| Example 1 | 1.0 | 5.0 | 80 | 12.00 | 14.91 | 6.10 | 0.41 | 191 | 0.5/5.0 |
| Example 2 | 0.5 | 3.0 | 100 | 8.00 | 15.25 | 4.88 | 0.32 | 238 | 2.5/8.9 |
| Example 3 | 0.5 | 5.0 | 80 | 8.00 | 14.73 | 3.79 | 0.26 | 290 | 1.8/7.5 |
| Example 4 | 1.0 | 0.5 | 80 | 8.40 | 11.70 | 5.02 | 0.43 | 174 | 1.0/8.5 |
| Example 5 | 1.0 | 1.0 | 80 | 8.80 | 12.31 | 5.28 | 0.43 | 210 | 1.0/4.7 |
| Example 6 | 1.0 | 1.0 | 92 | 10.12 | 14.54 | 6.72 | 0.46 | 236 | 1.0/5.0 |
| Example 7 | 0.2 | 5.0 | 160 | 11.20 | 19.72 | 4.41 | 0.22 | 320 | 2.1/9.3 |
| Example 8 | 1.0 | 3.0 | 91 | 11.83 | 18.04 | 8.36 | 0.46 | 215 | 0.7/3.8 |
| Example 9 | 1.0 | 2.0 | 100 | 12.00 | 16.35 | 7.55 | 0.46 | 258 | 0.0/3.0 |
| Example 10 | 1.0 | 1.0 | 110 | 12.10 | 17.30 | 7.92 | 0.46 | 247 | 0.0/3.0 |
| Example 11 | 1.0 | 3.0 | 96 | 12.48 | 18.21 | 8.20 | 0.45 | 250 | 0.0/3.0 |
| Example 12 | 0.5 | 5.0 | 125 | 12.50 | 13.56 | 4.77 | 0.35 | 205 | 0.5/3.0 |
| Example 13 | 0.5 | 3.0 | 160 | 12.80 | 13.98 | 5.21 | 0.37 | 189 | 0.1/5.9 |
| Example 14 | 0.5 | 5.0 | 130 | 13.00 | 16.21 | 5.93 | 0.37 | 241 | 0.9/4.3 |
| Example 15 | 1.0 | 4.0 | 93 | 13.02 | 17.33 | 7.90 | 0.46 | 255 | 0.0/3.0 |
| Example 16 | 1.0 | 3.0 | 101 | 13.13 | 19.11 | 8.73 | 0.46 | 284 | 0.8/3.7 |
| Example 17 | 1.0 | 5.0 | 90 | 13.50 | 17.67 | 8.04 | 0.46 | 234 | 0.0/3.7 |
| Example 18 | 1.0 | 3.0 | 130 | 16.90 | 24.92 | 13.51 | 0.54 | 324 | 0.7/1.0 |
| Example 19 | 1.0 | 3.0 | 140 | 18.20 | 26.92 | 14.62 | 0.54 | 349 | 0.7/0.7 |
| Example 20 | 3.0 | 1.0 | 60 | 18.60 | 10.59 | 6.92 | 0.65 | 245 | 0.7/5.3 |
| Example 21 | 2.0 | 3.0 | 86 | 19.78 | 17.57 | 10.39 | 0.59 | 262 | 1.0/3.0 |
| Example 22 | 1.0 | 15.0 | 80 | 20.00 | 16.39 | 6.98 | 0.43 | 215 | 0.8/4.0 |
| Example 23 | 3.0 | 3.0 | 70 | 23.10 | 15.38 | 10.14 | 0.66 | 244 | 0.8/4.0 |
| Example 24 | 3.0 | 1.0 | 80 | 24.80 | 13.31 | 8.72 | 0.66 | 336 | 1.0/3.0 |
| Example 25 | 4.0 | 3.0 | 60 | 25.80 | 13.22 | 9.67 | 0.73 | 264 | 1.7/4.3 |
| Example 26 | 5.0 | 3.0 | 50 | 26.50 | 10.49 | 7.70 | 0.73 | 202 | 1.5/6.0 |
| Example 27 | 5.0 | 5.0 | 50 | 27.50 | 10.24 | 7.59 | 0.74 | 247 | 0.8/4.7 |
| Example 28 | 5.0 | 4.0 | 53 | 28.62 | 10.77 | 7.94 | 0.74 | 259 | 0.7/4.3 |
| Example 29 | 5.0 | 3.0 | 55 | 29.15 | 11.60 | 8.51 | 0.73 | 250 | 0.7/4.2 |
| Example 30 | 5.0 | 2.0 | 61 | 31.72 | 12.15 | 8.85 | 0.73 | 252 | 2.0/5.0 |
| Example 31 | 5.0 | 3.0 | 60 | 31.80 | 12.80 | 9.31 | 0.73 | 285 | 1.7/5.0 |
| Example 32 | 1.0 | 30.0 | 80 | 32.00 | 17.75 | 8.04 | 0.45 | 219 | 0.5/5.3 |
| Example 33 | 5.0 | 1.0 | 65 | 33.15 | 11.91 | 8.59 | 0.72 | 245 | 1.8/6.0 |
| Example 34 | 5.0 | 0.5 | 80 | 40.40 | 11.86 | 8.62 | 0.73 | 208 | 1.7/6.0 |
| Example 35 | 10.0 | 1.0 | 40 | 40.40 | 6.95 | 5.36 | 0.77 | 316 | 1.3/6.0 |
| Example 36 | 5.0 | 1.0 | 80 | 40.80 | 13.30 | 9.67 | 0.73 | 427 | 0.3/2.3 |
| Example 37 | 5.0 | 5.0 | 80 | 44.00 | 17.14 | 12.48 | 0.73 | 455 | 0.2/2.3 |
| Example 38 | 5.0 | 15.0 | 80 | 52.00 | 19.15 | 14.26 | 0.74 | 483 | 0.3/2.0 |
| Example 39 | 5.0 | 30.0 | 80 | 64.00 | 19.45 | 14.37 | 0.74 | 525 | 0.2/2.0 |
| Example 40 | 20.0 | 1.0 | 35 | 70.35 | 6.40 | 5.07 | 0.79 | 237 | 1.5/5.3 |
| Example 41 | 10.0 | 1.0 | 80 | 80.80 | 13.65 | 10.33 | 0.76 | 570 | 0.2/2.0 |
| Example 42 | 15.0 | 1.0 | 65 | 98.15 | 9.85 | 7.75 | 0.79 | 490 | 0.8/4.5 |
| Example 43 | 15.0 | 3.0 | 70 | 107.10 | 12.81 | 10.09 | 0.79 | 452 | 1.2/3.0 |
| Comparative Example 7 | 20.0 | 3.0 | 35 | 71.05 | 7.28 | 6.22 | 0.85 | Non measurable | Non measurable |
| Comparative Example 8 | 10.0 | 3.0 | 80 | 82.40 | 11.02 | 9.85 | 0.89 | 729 | 0.2/2.0 |
| Comparative Example 9 | 10.0 | 3.0 | 90 | 92.70 | 11.80 | 10.05 | 0.85 | 745 | 0.1/2.5 |
| Comparative Example 10 | 10.0 | 1.0 | 100 | 101.00 | 14.25 | 12.02 | 0.84 | 760 | 0.4/1.8 |
| Comparative Example 11 | 15.0 | 5.0 | 70 | 108.50 | 13.25 | 11.27 | 0.85 | 713 | 0.9/2.8 |
| Comparative Example 12 | 20.0 | 1.0 | 55 | 110.55 | 8.80 | 7.15 | 0.81 | 780 | 0.2/1.5 |
| Comparative Example 13 | 20.0 | 2.0 | 55 | 111.10 | 7.36 | 6.02 | 0.82 | 720 | 0.8/2.0 |
| Comparative Example 14 | 15.0 | 1.0 | 80 | 120.80 | 12.75 | 10.61 | 0.83 | 768 | 0.0/1.7 |
| Comparative Example 15 | 20.0 | 3.0 | 60 | 121.80 | 9.02 | 8.11 | 0.90 | 820 | 0.0/1.5 |

TABLE 1-continued

|  | $t_s$ (sec) | $t_r$ (sec) | C (the number of times) | $G_f$ | $T_s$ (nm) | $T_h$ (nm) | $T_h/T_s$ | Gas permeability (sec/100 cc) | Heat shrinkage (MD/TD, %) |
|---|---|---|---|---|---|---|---|---|---|
| Comparative Example 16 | 20.0 | 1.0 | 80 | 160.80 | 13.44 | 11.01 | 0.82 | 832 | 0.0/1.7 |
| Comparative Example 17 | 20.0 | 3.0 | 80 | 162.40 | 14.43 | 12.37 | 0.86 | Non measurable | Non measurable |

$T_s$ is a measured thickness of the inorganic oxide layer formed on a surface of the manufactured porous separator, $T_h$ is a measured thickness of the inorganic oxide layer formed in internal pores at a position corresponding to ½ of a total thickness of the porous separator in a direction from the surface of the porous separator to the center of the porous separator.

$G_f$ represents a relational value of the time ($t_s$) for injecting a metal precursor, the time ($t_r$) for injecting an oxidant, and the number of repetitions (C) of the atomic layer deposition process, which is shown as follows:

$$G_f = \{(10t_s + t_r) \times C\}/100$$

It was confirmed from Examples ($G_f$ was 8 to 108, $T_h/T_s$ was 0.22 to 0.79) and Comparative Examples that when the $G_f$ was 8.0 or more, and the thickness ratio ($T_h/T_s$) of the inorganic oxide layer was 0.80 or less, the separator having excellent heat shrinkage and good gas permeability was manufactured.

Specifically, it was confirmed from Examples 2, 3 and 4 and Comparative Example 6 that when the $G_f$ was about 8.0, the heat shrinkage of the separator was remarkably changed. It could be confirmed from the remaining Examples that as the $G_f$ was larger, the heat shrinkage was smaller. In particular, it was confirmed from Examples 40, 42 and 43 and Comparative Examples 12, 13 and 16 that the thickness ratio ($T_h/T_s$) of the inorganic oxide layer was about 0.80, and the gas permeability was remarkably changed. In all of Comparative Examples 7 to 17, in particular, the gas permeability (time taken for gas permeation) exceeded 700, which was rapidly high, and thus, the separators of Comparative Examples 7 to 17 could not be used for the separator for a lithium secondary battery.

Figure 1:
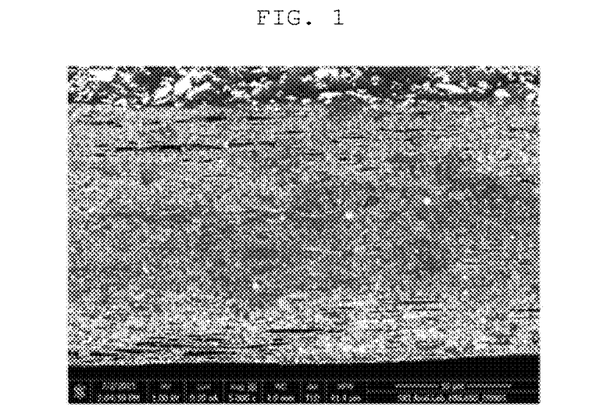
FIG. 1 is an electron microscope image showing a surface of a separator of Example 1.
Figure 2:
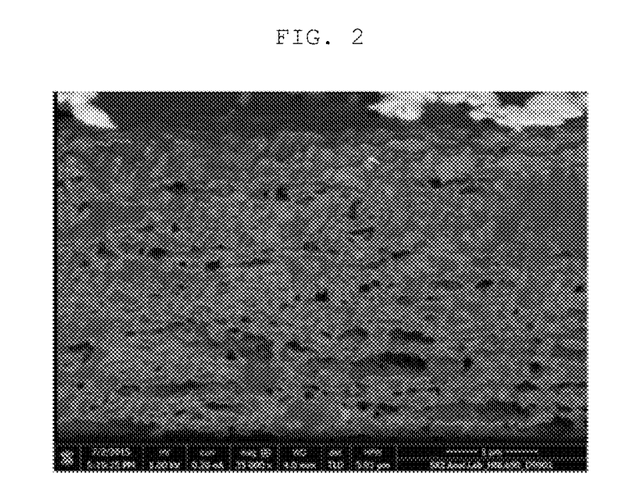
FIG. 2 is an electron microscope image showing a surface of a separator of Example 25.
Figure 3:
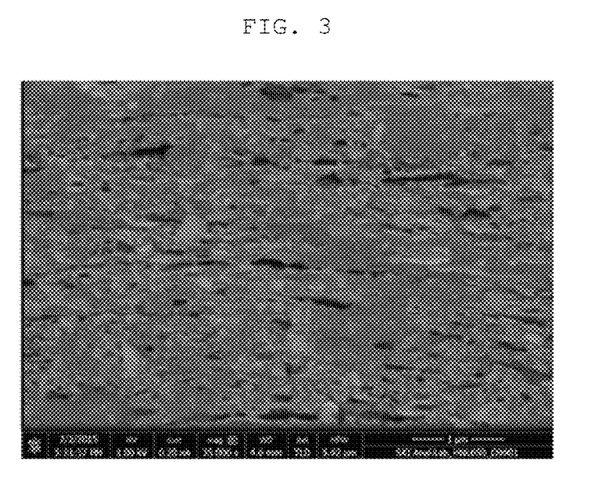
FIG. 3 is an electron microscope image showing an inside of the separator of Example 25.
Figure 4:
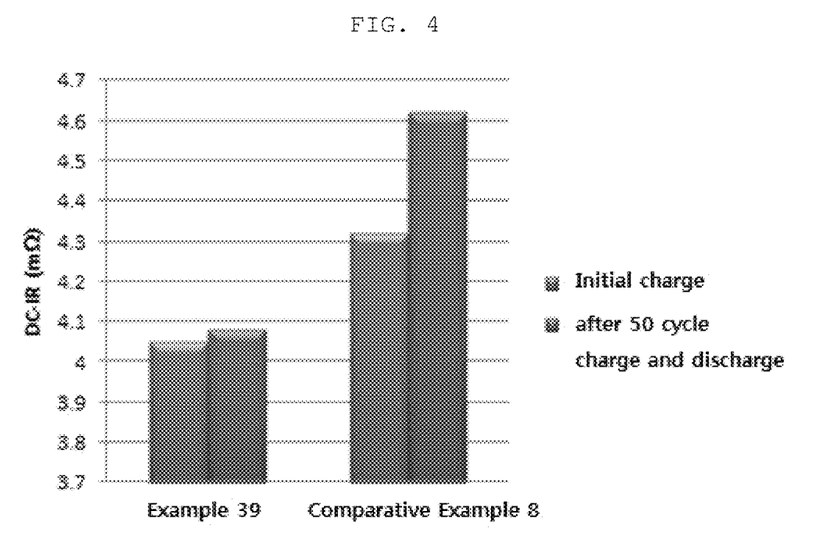
FIG. 4 shows comparison of direct current internal resistance (DCIR) values between batteries manufactured by using separators of Example 39 and Comparative Example 8.

FIG. 4 shows comparison of output characteristics of batteries manufactured using the separators of Example 39 and Comparative Example 8 through DC-IR measurement. As shown in FIG. 4, when the gas permeability was high, the DC-IR was increased, which could lead to deterioration of output characteristics due to an increase in output resistance.

The porous separator according to the present disclosure may have excellent permeability and excellent electrolyte impregnability and may be thinned to improve battery performance. In addition, it is possible to provide a battery having excellent stability by securing current blocking property through a high melting point and a dense pore structure, which may be utilized for various electrochemical devices.

What is claimed is:

1. A porous separator comprising:
an inorganic oxide layer formed on a porous substrate having an average pore diameter of 30 to 45 nm by an atomic layer deposition process,
wherein a thickness of the inorganic oxide layer is decreased in a direction from a surface of the porous substrate to a center thereof, and the following Relational Equations I and II are satisfied:

$$8 \leq \{(10t_s + t_r) \times C\}/100 \quad \text{[Relational Equation I]}$$

($t_s$ is time (sec) for injecting a metal precursor, $t_r$ is time (sec) for injecting an oxidant, and C is the number of repetitions of the atomic layer deposition process)

$$T_h/T_s \leq 0.80 \quad \text{[Relational Equation II]}$$

($T_s$ is a thickness (nm) of the inorganic oxide layer on a surface of the porous separator, $T_h$ is a thickness (nm) of the inorganic oxide layer formed in internal pores at a position corresponding to ½ of a total thickness of the porous separator in a direction from the surface of the porous separator to the center of the porous separator), and
wherein the thickness of the inorganic oxide layer on the surface is 15.25 nm≤$T_s$≤30.0 nm and wherein a gas permeability of the porous separator is less than or equal to 525 (sec/100 cc).

2. The porous separator of claim 1, wherein the time (sec) for injecting a metal precursor is 0.1≤$t_s$≤20, and the time (sec) for injecting an oxidant is 0.5≤$t_r$≤30.

3. The porous separator of claim 2, wherein the number of repetitions of the atomic layer deposition process is 35 to 160.

4. The porous separator of claim 1, wherein the thickness (nm) of the inorganic oxide layer formed in internal pores at a position corresponding to ½ of a total thickness of the porous separator in a direction from the surface of the porous separator to the center of the porous separator is 1.0≤$T_h$≤15.

5. The porous separator of claim 1, wherein the porous polymer substrate has a porosity of 50 to 70%.

6. The porous separator of claim 1, wherein the inorganic oxide layer includes one or more selected from the group consisting of $SrTiO_3$, $SnO_2$, $CeO_2$, MgO, NiO, CaO, ZnS, ZnOS, $ZrO_2$, $Y_2O_3$, SiC, $CeO_2$, MgO, $WO_3$, $Ta_2O_5$, $RuO_2$, NiO, $BaTiO_3$, $Pb(Zr, Ti)O_3$(PZT), $HfO_2$, $SrTiO_3$, NiO, $ZrO_2$, $Al_2O_3$, $SiO_2$, $TiO_2$, and ZnO.

7. The porous separator of claim 1, wherein the porous substrate has a thickness of 20 to 30 μm.

* * * * *

UNITED STATES PATENT AND TRADEMARK OFFICE
CERTIFICATE OF CORRECTION

PATENT NO. : 10,693,116 B2
APPLICATION NO. : 15/485785
DATED : June 23, 2020
INVENTOR(S) : Hye Jin Kim et al.

Page 1 of 1

It is certified that error appears in the above-identified patent and that said Letters Patent is hereby corrected as shown below:

In the Claims

Column 14, Line 47, Claim 4, delete "$1.0 \leq T_b \leq 15$." and insert -- $1.0 \leq T_h \leq 15$. --

Signed and Sealed this
Tenth Day of November, 2020

Andrei Iancu
*Director of the United States Patent and Trademark Office*